US008629061B2

(12) United States Patent
Murali et al.

(10) Patent No.: US 8,629,061 B2
(45) Date of Patent: Jan. 14, 2014

(54) METHOD FOR THREE-DIMENSIONAL PACKAGING OF ELECTRONIC DEVICES

(75) Inventors: Venkatesan Murali, San Jose, CA (US); Arvind Chari, Saratoga, CA (US); Gopal Prabhu, San Jose, CA (US)

(73) Assignee: GTAT Corporation, Nashua, NH (US)

( * ) Notice: Subject to any disclaimer, the term of this patent is extended or adjusted under 35 U.S.C. 154(b) by 41 days.

(21) Appl. No.: 13/490,460

(22) Filed: Jun. 7, 2012

(65) Prior Publication Data

US 2013/0203251 A1 Aug. 8, 2013

Related U.S. Application Data

(60) Provisional application No. 61/596,696, filed on Feb. 8, 2012.

(51) Int. Cl.
*H01L 21/768* (2006.01)

(52) U.S. Cl.
USPC .................................. 438/667; 257/E21.585

(58) Field of Classification Search
None
See application file for complete search history.

(56) References Cited

U.S. PATENT DOCUMENTS

| | | | |
|---|---|---|---|
| 6,544,862 B1 | 4/2003 | Bryan | |
| 7,713,835 B2 | 5/2010 | Pillalamarri | |
| 8,049,327 B2 | 11/2011 | Kuo et al. | |
| 8,097,525 B2 | 1/2012 | Barth, Jr. et al. | |
| 8,114,772 B2 | 2/2012 | Lee et al. | |
| 8,124,458 B2 | 2/2012 | Su | |
| 8,125,055 B2 | 2/2012 | Robinson | |
| 2009/0071530 A1 | 3/2009 | Chan et al. | |
| 2010/0032007 A1 | 2/2010 | Hilali et al. | |
| 2010/0240169 A1 | 9/2010 | Petti et al. | |
| 2012/0091587 A1 | 4/2012 | Or-Bach et al. | |
| 2012/0106117 A1 | 5/2012 | Sundaram et al. | |

FOREIGN PATENT DOCUMENTS

KR 19940016682 A 7/1994

OTHER PUBLICATIONS

Celler and Wolf, Smart Cut—A guide to the technology, the process, the products, Soitec, Jul. 2003, pp. 1-8. www.soitec.com/pdf/SmartCut_WP.pdf.
Hosali et al., Through-Silicon Via Fabrication, Backgrind, and Handle Wafer Technologies, Wafer Level 3-D ICs Process Technology, 2008, pp. 85-116, Springer Science+Buiness Media, LLC, New York.
Nenni et al., Three-Dimensional Integrated Circuit Wiki, SemiWiki, Feb. 14, 2011, SemiWiki.com.
Sunohara et al., Silicon Interposer with TSVs (Through Silicon Vias) and Fine Multilayer Wiring, 2008 Electronic Components and Technology Conference, IEEE pp. 847-852.
International Search Report and Written Opinion dated May 27, 2013 for PCT Application No. PCT/US2013/024685.

*Primary Examiner* — Seahvosh Nikmanesh
(74) *Attorney, Agent, or Firm* — The Mueller Law Office, P.C.

(57) ABSTRACT

An interposer is fabricated from a lamina. A donor body is provided, ions are implanted into a first surface of the donor body to define a cleave plane, a temporary carrier is separably contacted to the donor body, and the lamina is cleaved from the donor body. The lamina has front surface and a back surface, with a thickness from the front surface to the back surface. A via hole is formed in the lamina, where the via hole extends through the thickness of the lamina. The temporary carrier is removed from the lamina, and the lamina may be fabricated into an interposer for three-dimensional integrated circuit packages.

5 Claims, 6 Drawing Sheets

METHOD FOR THREE-DIMENSIONAL PACKAGING OF ELECTRONIC DEVICES

RELATED APPLICATIONS

This application claims priority to U.S. Provisional Patent Application No. 61/596,696 filed Feb. 8, 2012, and entitled "Method for Three-Dimensional Packaging of Electronic Devices," which is hereby incorporated by reference for all purposes.

BACKGROUND OF THE INVENTION

In the continued evolution of integrated circuit (IC) technology, geometric scaling has reduced components to sizes that have become increasingly challenging to produce. To advance the semiconductor industry to the next level, three-dimensional (3D) packaging has been growing in development since the 1980's. In 3D packaging, chips are stacked vertically on each other, which provides many advantages such as denser circuitry, heterogeneous integration, and faster interconnections due to the shorter distance between layers compared to conventional wirebonds. Connections between layers in 3D IC's are typically achieved through the use of through-silicon vias (TSV's), which are conductive paths through a silicon wafer or die. The ability to produce TSV's of the necessary sizes and accuracy to meet the demands of 3D packaging technology, with cost effective methods, is of key importance to the development of this industry.

SUMMARY OF THE INVENTION

An interposer is fabricated from a lamina. In some embodiments of the methods, a donor body is provided, ions are implanted into a first surface of the donor body to define a cleave plane, a temporary carrier is separably contacted to the donor body, and the lamina is cleaved from the donor body. The lamina has front surface and a back surface, with a thickness from the front surface to the back surface. A via hole is formed in the lamina, where the via hole extends through the thickness of the lamina. The temporary carrier is removed from the lamina.

BRIEF DESCRIPTION OF THE DRAWINGS

Each of the aspects and embodiments of the invention described herein can be used alone or in combination with one another. The aspects and embodiments will now be described with reference to the attached drawings.

DETAILED DESCRIPTION OF THE EMBODIMENTS

Figure 1:
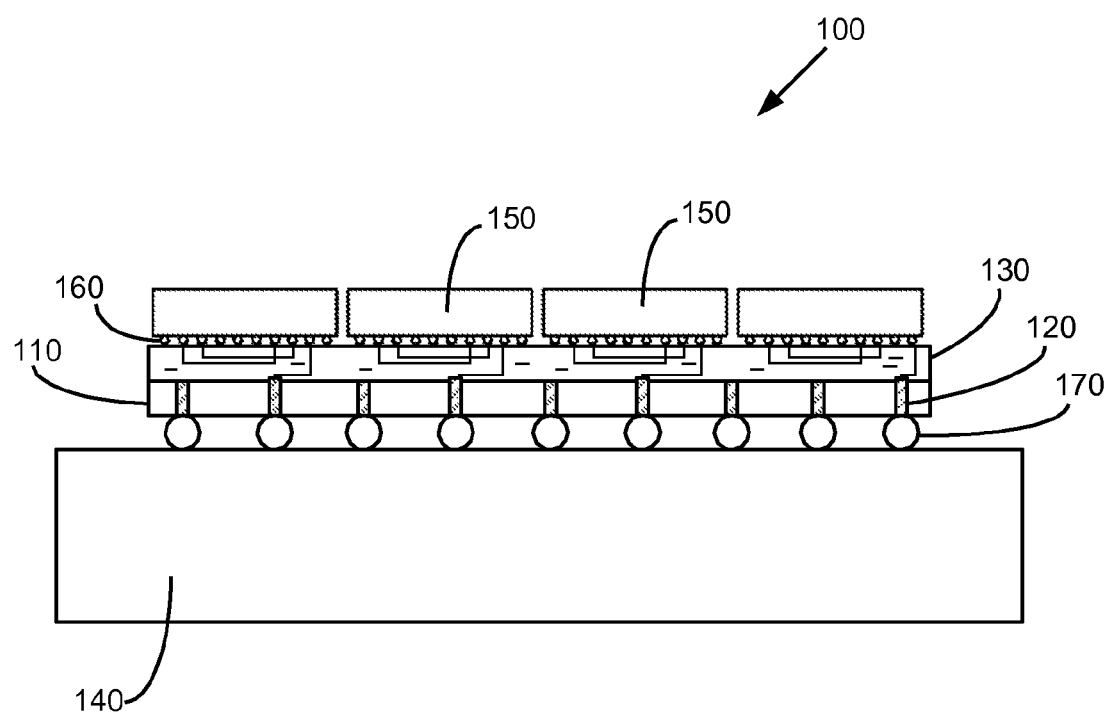
FIG. 1 illustrates a cross-sectional view of a 3D integrated circuit package using a silicon interposer as known in the art.

In conventional methods, through-silicon vias are formed in a silicon die or wafer by first forming a hole through a partial thickness of the die or wafer. The via hole is formed by either laser drilling or etching, with the dimensions of the vias being greatly determined by the aspect ratio limits at which metal is able to fill the holes. Deeper holes require larger diameters for metal filling, and thus the circuit density of a chip can be limited by the size of the vias. In addition, the process of manufacturing vias can affect material properties of the surrounding silicon substrate, which can alter the threshold voltage values of nearby transistors. Thus, vias must be spaced adequately to avoid this threshold shift issue, which also limits circuit density. After the via holes are formed, the holes may be lined with an insulation layer and filled with a conductor such as copper or tungsten. Then the die or wafer is ground from the backside to reveal the completed TSV and to thin the die or wafer to the appropriate thickness. This wafer thinning is a multi-step process involving grinding, polishing, and wet and/or dry etching to relieve stress caused by grinding. The back-grinding results in non-uniformities in thickness across a wafer. To reduce the non-uniformities, die to die processing is performed, which can be time-consuming and increase costs. Furthermore, the die or wafers must be supported by a handle or substrate which are adhered to the die or wafer during the processing, which requires further manufacturing steps in order to separate the substrates during assembly.

Three-dimensional integrated circuits (3D IC's) may be built in different ways. In monolithic 3D IC's, circuit layers are built directly on top of each other, on one semiconductor wafer substrate. Each layer contains circuit elements and interconnections—both horizontal and vertical—incorporated into the layer. Thus in monolithic 3D IC's, there is no need for through-silicon vias since the layers are directly interconnected. In other approaches for fabricating 3D IC's, separate electronic components are built and then aligned and bonded to each other to form the 3D package. The electronic components may be processed as wafer-on-wafer, die-on-wafer, or die-on-die. Thinning and formation of through-silicon vias may be performed either before or after bonding.

In die-to-wafer stacking, the dies are typically fairly thick, such as 70-100 μm, and thus the drilled or etched hole must be at least this deep in order for the via to be exposed after thinning. However, it is critical to maintain an aspect ratio (hole depth:hole diameter) on the order of 5-10 for the via hole to enable metal to adequately fill the hole. Thus, via diameters for dies are required to be more than 10 μm when via holes are made by this method. For wafer-to-wafer stacking, the bonded wafer layer is supported by a substrate and therefore may be thinner, such as down to 10 μm. Thus, TSV holes on bonded wafers may be shallower and have diameters that may be down to 1 μm. However, the need for grinding on wafer stacks still results in undesirable non-uniformities across the wafer. Additionally, back-grinding requires that the die or wafer be ground to the level of the shortest via. Consequently, manufacturing variations in hole depth during TSV formation can affect later grinding steps.

Another approach for building 3D integrated packages is through the use of silicon interposers, as shown in an electronic package 100 of FIG. 1. In this approach, a silicon interposer 110 serves solely as an interconnecting layer, by providing vias 120 between a package substrate 140 and individual dies 150. A metal interconnect layer 130 may also be used to connect interposer 110 to the dies 150. An advantage of this silicon interposer approach is that there is no threshold shift issue caused by the vias 120 since there are no transistors in the interposer 110. In addition, many smaller, individual dies 150 can be connected to the package substrate 140, which allows for higher yields and more design flexibility compared to bonding a single, large wafer to the substrate. Microbumps 160 connect metal interconnect layer 130 to dies 150, while solder bumps 170 connect the opposite surface of interposer 110 to package substrate 130. Vias 120 in silicon interposer 110 are fabricated using the conventional methods described above; that is, by drilling or etching a channel from one surface of a silicon wafer and then grinding from the backside to expose the closed end of the via. The vias in an interposer may also be formed by etching the vias part-way from the one side and then etching through from the opposite side of the wafer. In this two-sided etching technique, the via dimensions still remain limited by etching parameters and the metal filling process.

In the present invention, methods are described in which a thin, free standing lamina is contacted to a temporary carrier and used to fabricate a silicon interposer. For the purposes of this disclosure, the term "carrier" shall be used interchangeably with "support element" and "susceptor." The free standing lamina may be formed by, for example, the methods of Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference. The free standing lamina of the present disclosure has a thickness tailored to be thin enough to eliminate grinding but thicker than current ultra-thin films. Via holes are formed through the entire thickness of the lamina, thus eliminating the need for grinding to expose the closed end of the via or to thin a wafer. Consequently, the silicon interposers formed from the free standing lamina of this disclosure allow formation of smaller diameter vias than in conventional manufacturing, since the via holes are through-holes rather than blind holes. Smaller vias are easier to fill with a conductive material and enable a finer pitch. The interposers formed with free standing lamina also provide further functional benefits such as lower capacitance and easier handling compared to ultra-thin films. Furthermore, interposers formed of thin semiconductor laminae reduce cost, in that silicon is not wasted through kerf loss or by fabrication of an unnecessarily thick cell, compared to forming the silicon layers from sliced wafers. In addition, the same donor wafer may beneficially be reused to form multiple laminae, further reducing cost, and may be resold after exfoliation of multiple laminae for some other use.

Figure 2A:
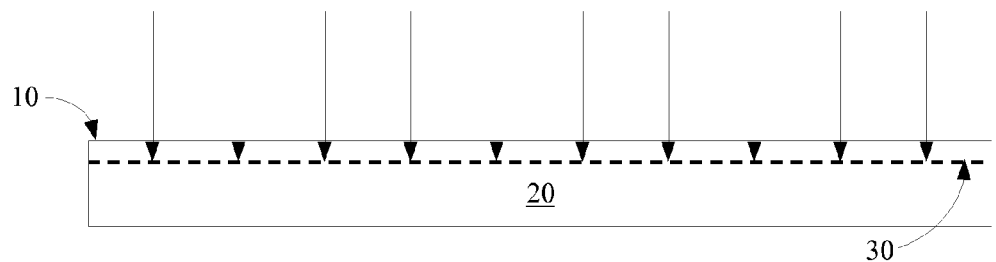
FIGS. 2A-2C show cross-sectional views of a lamina formed by ion cleaving, as described in Sivaram, et al.
Figure 2B:
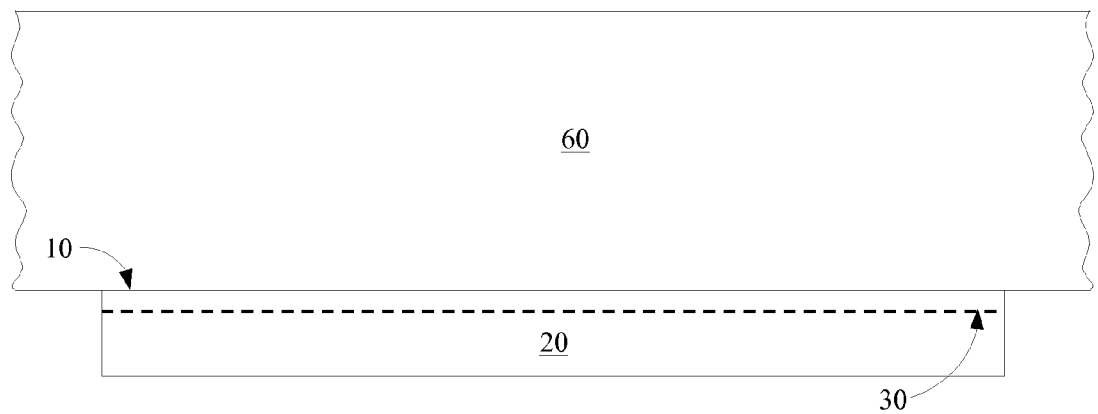
Figure 2C:
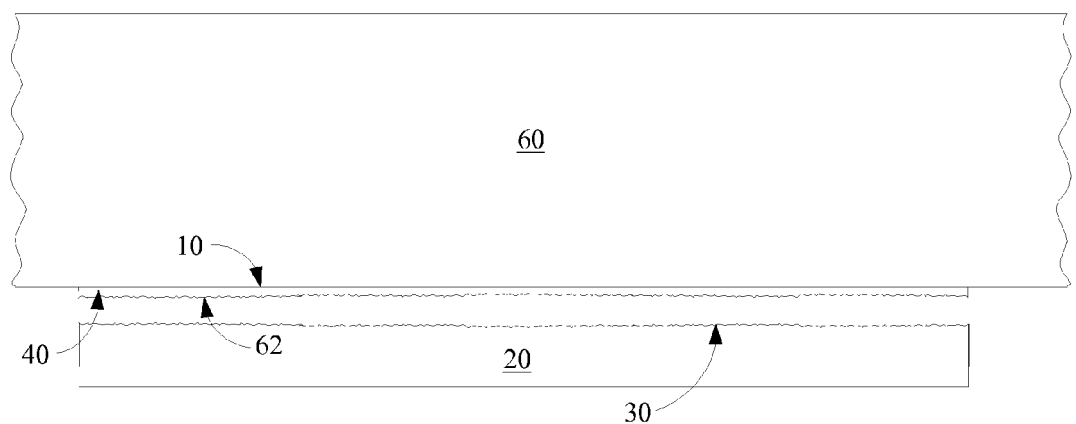

In Sivaram, the fabrication of a photovoltaic cell comprising a thin semiconductor lamina formed of non-deposited semiconductor material is described. Referring to FIG. 2A, in embodiments of Sivaram et al., a semiconductor donor body 20 is implanted through a first surface 10 with one or more species of gas ions, for example hydrogen and/or helium ions. The implanted ions define a cleave plane 30 within the semiconductor donor body. As shown in FIG. 2B, donor body 20 is affixed at first surface 10 to a receiver 60. Referring to FIG. 2C, an anneal step causes a lamina 40 to cleave from donor body 20 at cleave plane 30, creating a second surface 62. In embodiments of Sivaram et al., additional processing before and after the cleaving step forms a photovoltaic cell comprising semiconductor lamina 40, which is between about 0.2 and about 100 microns (μm) thick, for example between about 0.2 and about 50 μm thick, for example between about 1 and about 20 μm thick, in some embodiments between about 1 and about 10 μm thick or between about 4 and about 20 μm thick or between about 5 and about 15 μm thick, though any thickness within the named range is possible.

Figure 3:
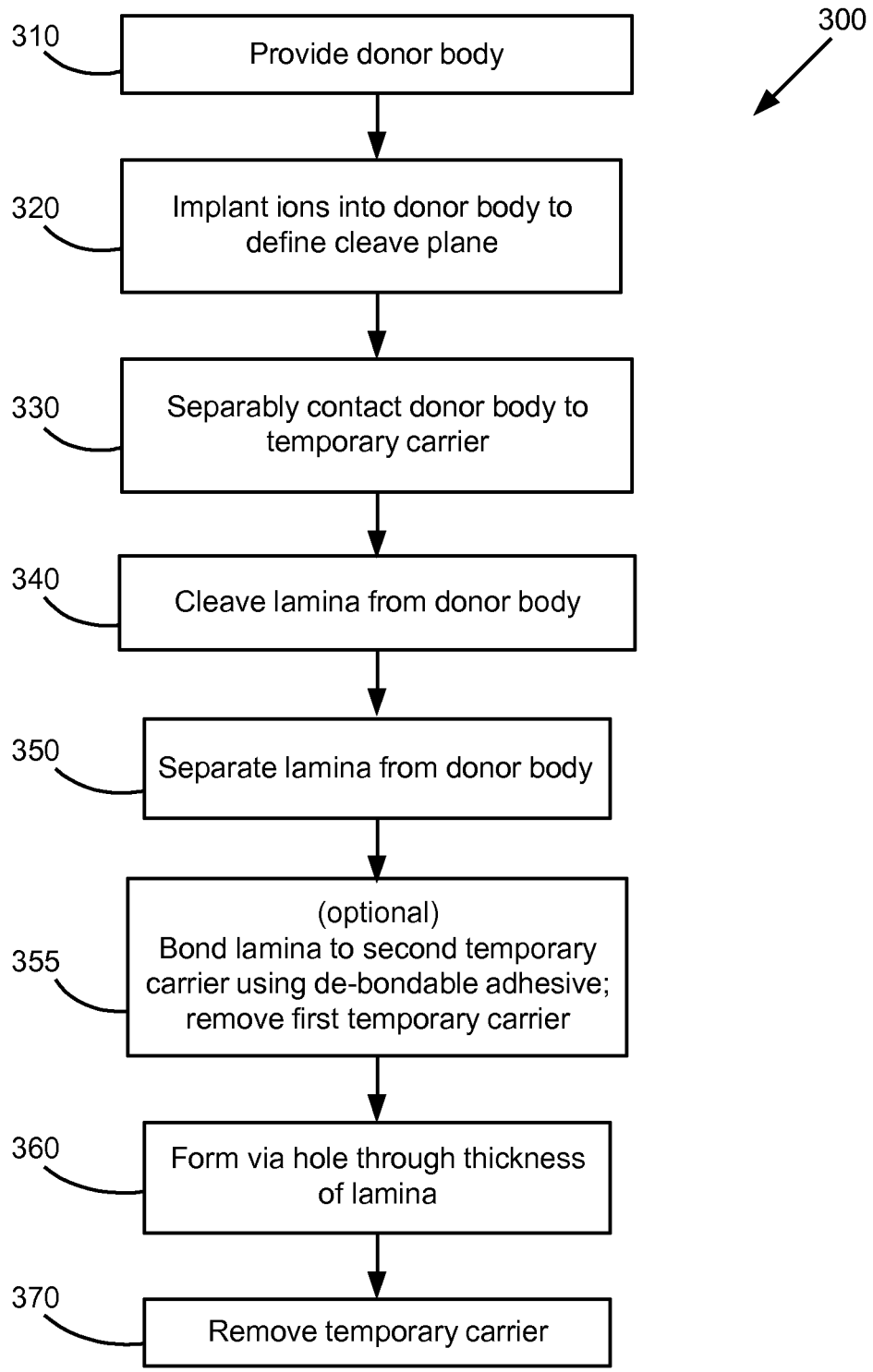
FIG. 3 is a flowchart of an exemplary method of forming an interposer.

FIG. 3 illustrates one embodiment of a method of the present disclosure, in which a free standing lamina is separably contacted to a temporary carrier and is used to form a silicon interposer. In flowchart 300 of FIG. 3, a donor body, such as a semiconductor material, is provided in step 310. In step 320, a top surface of the donor body is implanted with ions, such as hydrogen or helium, to define a cleave plane. Implant conditions may be adjusted to mitigate the appearance of physical defects (e.g., tears, cracks, rips, wave-front defects, radial striations, flaking or any combination thereof) in the lamina ultimately formed, as described in Kell et al., U.S. patent application Ser. No. 13/331,909, "Method and Apparatus for Forming a Thin Lamina" filed Dec. 20, 2011 owned by the assignee of the present invention and hereby incorporated by reference for all purposes. Physical defects include any defects which may cause reduced performance in completed cells. Implant conditions that may be adjusted to maximize the area that is substantially free of defects in the cleaved lamina include the temperature and/or the pressure applied to the donor body during implantation. In some embodiments the implant temperature may be maintained between 25 and 300° C., such as between 100 and 200° C. or between 120 and 180° C. The implant temperature may be adjusted depending upon the material and orientation of the donor body. Other implantation conditions that may be adjusted include initial process parameters such as implant dose and the ratio of implanted ions (e.g., H:He ratio). In some embodiments implant conditions may be optimized in combination with exfoliation conditions such as exfoliation temperature, exfoliation susceptor vacuum level, heating rate and/or exfoliation pressure in order to maximize the area that is substantially free of physical defects present in the lamina.

In some embodiments the donor body in steps 310 and 320 has undergone only general surface processing before implantation, such as polishing or formation of an oxide layer. That is, the donor body may be free of any prepared circuit elements or other patterns—such as transistors, horizontal interconnections, doped regions, or alignment marks—incorporated in the surface which is to be cleaved into a lamina. Patterns are understood by those skilled in the art as being intentional surface non-uniformities.

The donor body is separably contacted to a temporary support element in step 330 of FIG. 3. The temporary support element may be non-bonded such as, for example a susceptor assembly as described in Kell et al., U.S. patent application Ser. No. 13/331,915, "Method and Apparatus for Forming a Thin Lamina" filed Dec. 20, 2011 owned by the assignee of the present invention and hereby incorporated by reference for all purposes. The donor body beneficially is separably contacted with a temporary carrier, without adhesive or permanent bonding, where the temporary carrier is a support element such as a susceptor assembly as described in Kell in order to stabilize the lamina during exfoliation. In conventional methods, donor bodies or thin film silicon lamina in various stages of manufacture may be affixed to temporary carriers using adhesive or via chemical bonding. When adhesive is used, additional steps are required to initiate the debonding of the lamina and/or to clean the surface of the lamina and the temporary carrier after detachment. Alternatively, support elements may be dissolved or otherwise removed and rendered unusable for further support steps. Thus, bonded supports require additional manufacturing steps to remove the support element, and the support element is often for single use only. In contrast, the use of a non-bonded temporary support element advantageously decreases cost by reducing manufacturing steps. Additionally, a non-bonded temporary carrier facilitates processing on either side of the semiconductor lamina since the carrier may be easily detached from the lamina. The contact may be direct contact between the donor body and support element, such as by vacuum or electrostatic force, without adherents or bonding steps that require any chemical or physical steps to disrupt the contact beyond merely lifting the donor body or lamina from the susceptor. The susceptor may then be reused as a support element without further processing.

Still referring to FIG. 3, following the contacting of the donor body to the temporary carrier, heat may be applied to the donor body to exfoliate and cleave a lamina from the donor body at the cleave plane in step 340. Exfoliation conditions may be optimized to cleave the lamina from the donor body in order to minimize physical defects in a lamina exfoliated in the absence of an adhered support element, as described in Sivaram, and in Kell, U.S. patent application Ser. No. 13/331,909. Exfoliation parameters to be optimized may include, for example, pressure, thermal profile, and peak temperatures. Separably contacting the lamina to a support element during the steps of exfoliation and damage anneal provides several significant advantages. The steps of exfoliation and anneal take place at relatively high temperature. If a pre-formed support element is affixed, such as with adhesives or chemicals, to the donor body before these high-temperature steps, it will necessarily be exposed to high temperature along with the lamina, as will any intervening layers. Many materials cannot readily tolerate high temperature, and if the coefficients of thermal expansion of the support element and the lamina are mismatched, heating and cooling will cause strain which may damage the thin lamina. Thus, a non-bonded support element provides for an optimized surface for lamina manufacture independent of bonding and debonding protocols that would potentially inhibit the formation of a defect free lamina. Annealing may occur before or after the lamina is separated from the donor body.

In step 350 of FIG. 3, the exfoliated lamina may be removed from the donor body by any means, such as those as described in Kell, U.S. patent application Ser. No. 13/331, 915. In some embodiments, the removal may utilize a deforming force on the lamina by a susceptor plate. In other embodiments the separable contact between the lamina and temporary support may be a vacuum force applied through a porous chuck plate to the donor body, where the vacuum force is able to remove the cleaved lamina from the donor body. After cleaving, the top surface of the donor body becomes a front surface of the lamina (e.g., surface 10 of FIG. 2C), while the cleaved surface becomes a back surface (e.g., surface 62 of FIG. 2C) of the lamina. Although the susceptor is initially contacted to the front surface of the lamina during the cleaving process, the lamina may be transferred using one or more steps to other temporary carriers on either the front or back surface of the lamina, as desired. The lamina has a thickness measured from the front surface to the back surface. The thickness of the lamina is determined by the ion implantation depth, and may be between about 0.1 and about 150 µm thick, for example between about 0.2 and about 50 µm, or in some embodiments between about 15 and about 40 µm thick, such as on the order of 20 µm, though any thickness within the named range is possible. The thickness of the lamina is tailored to be the thickness that is required for a finished interposer. The thickness may remain substantially unchanged during subsequent manufacturing steps, which advantageously removes the need for grinding or thinning of the wafer. For example, the thickness of the finished interposer may stay within 20% deviation of the thickness of the initially cleaved lamina, for example within a 15% or 10% deviation.

An optional step 355 in FIG. 3 includes contacting the lamina to a second carrier using a de-bondable adhesive. For example, the first carrier of step 330 may be used to transfer the lamina to the second carrier, where the second carrier is bonded to the lamina. The carrier may be contacted on either the front or back surface of the lamina, through one or more transfers from the temporary carrier of step 330. The de-bondable adhesive may include mechanical or chemical bonding to bond or de-bond the lamina to the carrier. The de-bondable adhesives may require certain steps to initiate the de-bonding of the lamina and/or to clean the surface of the lamina and the temporary carrier after detachment. In other embodiments, the de-bondable adhesive may be a decomposable adhesive as described in Brainard et al., U.S. patent application Ser. No. 13/456,134, "Method of Forming a Permanently Supported Lamina," filed Apr. 25, 2012, in which the adhesive is decomposed by, for example, application of heat or ultraviolet light.

In step 360, a via hole is formed through the thickness of the lamina. Via hole formation may be performed by, for example, laser drilling or etching. Because the thickness of the lamina has been provided in its final desired thickness, the present method advantageously enables holes to be formed through the entire thickness of the lamina. That is, the via holes are through-holes rather than blind holes as in conventional methods. Consequently, the aspect ratios of the via holes do not need to compensate for subsequent grinding steps or limitations of metal filling processes. Via holes formed through the lamina in step 360 may have diameters between, for example, 0.1 to 29 µm, or between 3 to 7 µm, for example on the order of 5 µm, which are smaller than is capable with conventional methods. The temporary susceptor for the lamina may be chosen to be suitable with the technique used for forming the via holes. In the case of laser drilling, for example, the susceptor may be made of a material having a wider band gap than the lamina. In one non-limiting example, the susceptor may be fabricated from silicon carbide (SiC), and the laser may be tuned to a wavelength (e.g., 500-600 nm) to allow laser energy to be absorbed the silicon lamina but allow any remaining energy to pass through the SiC. The SiC susceptor may have vacuum channels formed in it to provide a non-bonded vacuum contact. In another example, the temporary carrier may be glass, which is transparent to laser. The glass may be separably contacted to the lamina using, for example, a de-bondable adhesive. In the case of using wet etching to form the via holes, the temporary carrier may be, for example, bonded with a removable adhesive. In other embodiments, an oxide layer may be provided on the donor body prior to implanting ions, such that the oxide acts as an etch stop to prevent the carrier adhesive from being exposed to the chemical etch at the bottom of the via holes.

In step 370 of FIG. 3, the temporary carrier is removed. This temporary carrier may be the carrier of step 330, or it may be the optional second carrier of step 355. In some embodiments, additional processing steps may optionally occur prior to removing the temporary carrier of step 370. The additional processing steps may include, for example, depositing a dielectric layer (e.g., by chemical vapor deposition), depositing a seed layer (e.g., by sputtering copper), electroplating with copper or tungsten to fill the hole, polishing the electroplated metal and seed layers down to the lamina, forming interconnects as needed, and adding microbumps for interconnections to chips. These surface finishing steps typically will not alter the overall thickness of the provided lamina by more than 20% of its initial thickness. Other steps that may occur prior to removal of the temporary carrier include, for example, forming an oxide layer on the silicon interposer, or building a metal interconnect layer (e.g., layer 130 of FIG. 1) on the surface of the interposer.

Figure 4:
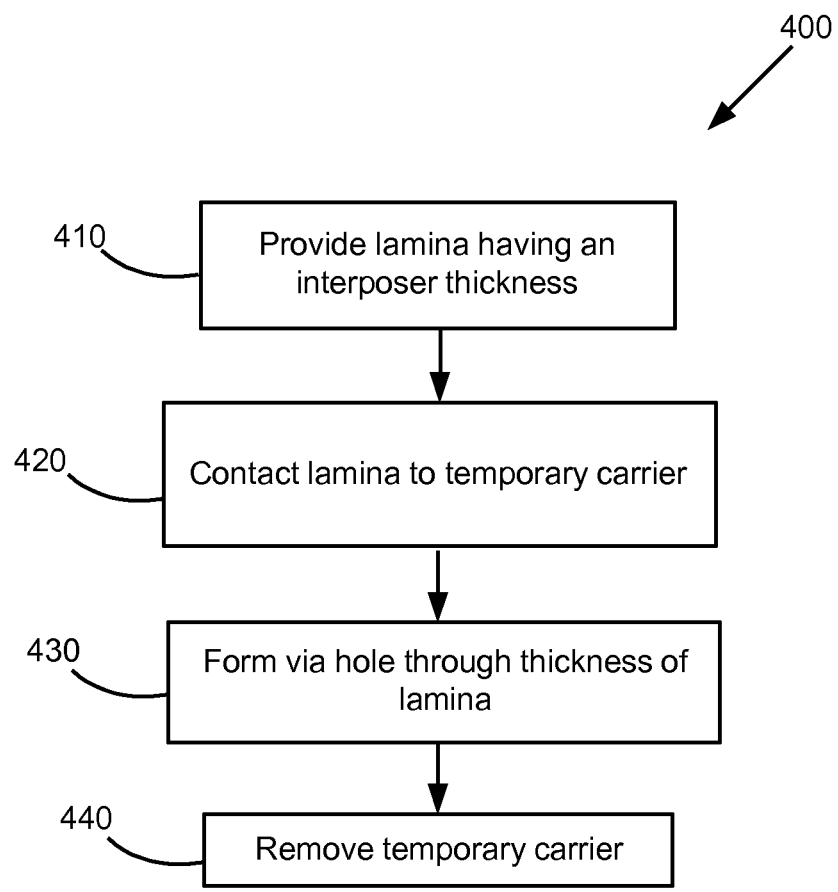
FIG. 4 is a flowchart of another embodiment of forming an interposer.

FIG. 4 illustrates a flowchart 400 showing another embodiment, in which a semiconductor lamina having a thickness appropriate for a finished silicon interposer—such as 15 to 40 µm—is provided in step 410. The lamina may have been produced by any desired method, such as an ion implantation with cleaving process; or through porous silicon formation, annealing, epitaxial growth, temporary bonding, and dissolving the porous silicon. The lamina is contacted to a temporary carrier in step 420, as described above in relation to steps 330 or 355 of FIG. 3. In step 430 of FIG. 4, a via hole is formed through the thickness of the lamina, as in step 360 of FIG. 3. When all via holes have been formed, the temporary carrier is removed in step 440. In other embodiments, additional fabrication steps to form finished TSV's may occur prior to removing the temporary carrier, as described in relation to FIG. 3 above.

Figure 5:
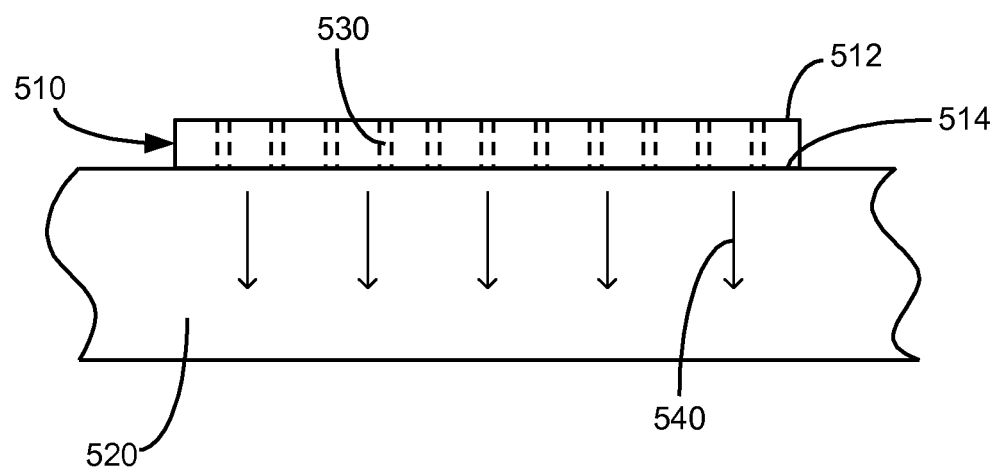
FIG. 5 depicts a cross-sectional view of an exemplary interposer and a temporary carrier.

FIG. 5 shows a cross-sectional view of an exemplary interposer according to the methods of FIG. 3 or 4. An exemplary lamina 510 is separably contacted to a temporary carrier 520. In various embodiments, as described in Kell, U.S. patent application Ser. No. 13/331,915, temporary carrier 520 is a plate of porous material, such as porous graphite, porous boron nitride, porous silicon, porous silicon carbide, laser-drilled silicon, laser-drilled silicon carbide, aluminum oxide, aluminum nitride, silicon nitride or any combination thereof. In such embodiments, a vacuum force applied to temporary carrier 520 causes lamina 510 to be contacted to and held against carrier 520, as indicated by arrows 540. Release of the vacuum force allows the lamina to be separably released from carrier 520. Via holes 530 are formed in lamina 510, where the via holes 530, as initially formed, extend through the entire thickness of the lamina 510—where the thickness is defined from the upper surface 512 to the lower surface 514 of lamina 510. In other embodiments, the carrier 520 may be a temporary carrier that is affixed using a de-bondable adhesive as described in relation to step 355 of FIG. 3. In further embodiments, the carrier 520 may be made of glass. The thickness of lamina 510 may be any thickness as desired for a finished silicon interposer. For example, the interposer 510 may have a thickness of 15 to 40 μm, such as on the order of 20 μm. In comparison, conventional interposers that are formed by grinding typically have thicknesses on the order of 150 μm. The via holes 530 may have a diameter of, for example, between 0.1 to 29 μm, or between 3 to 7 μm, for example on the order of 5 μm. This is in contrast to conventional interposers that have been formed by grinding, which have via diameters on the order of 30 μm. The smaller diameters which are able to be formed by the present methods also enable finer pitches, such as between 1 to 59 μm, or between 5 to 20 μm, such as on the order of 10 μm; compared to traditional silicon interposers with pitches on the order of 60 μm. The vias 530 may be lined with insulation and metal-filled according to conventional methods or the methods described above.

The interposers of the present methods enable formation of thicker layers than electronic circuits made directly from ultra-thin films that have been cleaved from ion implantation methods. Such ultra-thin films are often on the order of less than 2 μm, or even 100 nm or less, which requires them to be attached permanently to a substrate due to their fragility. Moreover, those ultra-thin films often have circuit elements formed in them prior to ion implantation. The present methods enable intermediate thicknesses that may be tailored to be thinner than ground interposers but thicker than ultra-thin films. The intermediate thicknesses of the present disclosure offer lower capacitance, and therefore faster performance, than ultra-thin films. Additionally, the ability to handle the intermediate thicknesses with the use of non-bonded temporary carriers allows circuit elements or other patterns to be formed after ion implantation, so that the circuit elements do not impact implantation, exfoliation and cleavage of the lamina.

Although certain embodiments described herein refer to semiconductor donor bodies and silicon interposers, other materials which may be provided as a free standing lamina are also applicable. For example, silicon carbide may be used as an interposer material in that it has a lower dielectric constant (9.7) than silicon (11.7) and thus would provide a lower capacitance for a given thickness.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention. Thus, it is intended that the present subject matter covers such modifications and variations.

What is claimed is:

1. A method of fabricating an interposer, the method comprising the steps of:
   providing a donor body having a first surface;
   implanting ions into the first surface of the donor body to define a cleave plane;
   separably contacting a first temporary carrier to the first surface of the donor body;
   cleaving a lamina from the donor body at the cleave plane, wherein the cleave plane forms a back surface of the lamina, wherein the first surface of the donor body is a front surface of the lamina, and wherein the lamina has a thickness from the front surface to the back surface;
   forming a via hole in the lamina, wherein the via hole extends through the thickness of the lamina;
   removing the first temporary carrier from the lamina; and
   bonding either the front surface or the back surface of the lamina to a second temporary carrier using a de-bondable adhesive;
   wherein the step of removing the first temporary carrier occurs after the step of bonding the lamina to the second temporary carrier; and
   wherein the step of forming a via hole in the lamina occurs after the step of removing the first temporary carrier.

2. A method of fabricating an interposer, the method comprising the steps of:
   providing a donor body having a first surface;
   implanting ions into the first surface of the donor body to define a cleave plane;
   separably contacting a first temporary carrier to the first surface of the donor body;
   cleaving a lamina from the donor body at the cleave plane, wherein the cleave plane forms a back surface of the lamina, wherein the first surface of the donor body is a front surface of the lamina, and wherein the lamina has a thickness from the front surface to the back surface;
   forming a via hole in the lamina, wherein the via hole extends through the thickness of the lamina;
   removing the first temporary carrier from the lamina; and
   fabricating the lamina into a three-dimensional integrated circuit after the step of forming a via hole, wherein the thickness of the cleaved lamina remains substantially unchanged from the step of cleaving to the step of fabricating.

3. The method of claim 2 wherein the thickness of the lamina remains within 20% deviation of its cleaved thickness.

4. A method of fabricating an interposer, the method comprising the steps of:
  providing a lamina having a front surface and a back surface, wherein the lamina has a thickness between the front surface and the back surface, and wherein the thickness is between 15 to 40 microns;
  contacting a temporary carrier to either the front or the back surface of the lamina;
  forming a via hole in the lamina, wherein the via hole, as initially formed, extends through the thickness of the lamina;
  removing the temporary carrier from the lamina; and
  fabricating the lamina into a three-dimensional integrated circuit after the step of forming a via hole, wherein the thickness of the cleaved lamina remains substantially unchanged between the step of providing a lamina and the step of fabricating the lamina into a three-dimensional integrated circuit.

5. The method of claim 4 wherein the thickness of the lamina remains within 20% deviation of its provided thickness.

* * * * *